United States Patent
Abe et al.

(10) Patent No.: US 6,965,154 B2
(45) Date of Patent: Nov. 15, 2005

(54) SEMICONDUCTOR DEVICE

(75) Inventors: Shunichi Abe, Hyogo (JP); Tetsuya Uebayashi, Hyogo (JP); Naoki Izumi, Hyogo (JP); Akira Yamazaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/810,813

(22) Filed: Mar. 29, 2004

(65) Prior Publication Data

US 2004/0178490 A1 Sep. 16, 2004

Related U.S. Application Data

(62) Division of application No. 09/892,539, filed on Jun. 28, 2001, now Pat. No. 6,737,736.

(30) Foreign Application Priority Data

Feb. 8, 2001 (JP) ......................................... 2001-032362

(51) Int. Cl.[7] ....................... H01L 29/00; H01L 23/495; H01L 23/06; H01L 23/48; H01L 23/34

(52) U.S. Cl. ..................... 257/506; 257/676; 257/695; 257/724; 257/735; 257/787; 257/684; 257/777

(58) Field of Search .................. 257/E23.135, E21.502, 257/E21.506, 676, 695, 724, 735, 787, E21.598, 684, 777, E23.066, E21.503, E25.013, E25.052, E23.133

(56) References Cited

U.S. PATENT DOCUMENTS

| 5,122,860 A | 6/1992 | Kikuchi et al. |
|---|---|---|
| 5,172,214 A | 12/1992 | Casto |
| 5,428,248 A | 6/1995 | Cha |
| 5,471,088 A | 11/1995 | Song |
| 5,640,044 A * | 6/1997 | Takehashi et al. .......... 257/666 |
| 5,689,135 A | 11/1997 | Ball |
| 5,703,407 A | 12/1997 | Hori |
| 5,721,452 A | 2/1998 | Fogal et al. |
| 5,770,888 A | 6/1998 | Song et al. |

(Continued)

FOREIGN PATENT DOCUMENTS

| JP | 5-21703 | 1/1993 |
|---|---|---|
| JP | 5-218295 | 8/1993 |
| JP | 2000-156464 | 6/2000 |
| JP | 2000-260936 | 9/2000 |
| JP | 2000-269409 | 9/2000 |

Primary Examiner—David E. Graybill
(74) Attorney, Agent, or Firm—Leydig, Voit & Mayer, Ltd.

(57) ABSTRACT

A semiconductor device and a manufacturing method thereof are provided with downsizing and densification achieved by reducing the thickness of the semiconductor device without increase in area. Terminal electrodes are arranged, in plan view, outside a region where semiconductor chips are arranged. A lower semiconductor chip is placed to overlap in the range of height with the terminal electrodes, an upper semiconductor chip is placed above the lower semiconductor chip, a wire connects the upper and lower semiconductor chips to the terminal electrodes, and an encapsulating resin encapsulates the upper and lower semiconductor chips and wire. The encapsulating resin has its bottom surface coplanar with the bottom surface of the terminal electrodes.

8 Claims, 24 Drawing Sheets

U.S. PATENT DOCUMENTS

| | | | |
|---|---|---|---|
| 5,783,463 A | * 7/1998 | Takehashi et al. | 438/112 |
| 5,801,439 A | 9/1998 | Fujisawa et al. | |
| 5,804,874 A | 9/1998 | An et al. | |
| 5,861,668 A | 1/1999 | Cha | |
| 5,963,433 A | 10/1999 | Kim | |
| 6,043,430 A | 3/2000 | Chun | |
| 6,075,284 A | 6/2000 | Choi et al. | |
| 6,087,722 A | 7/2000 | Lee et al. | |
| 6,118,174 A | 9/2000 | Kim | |
| 6,163,076 A | 12/2000 | Lee et al. | |
| 6,215,193 B1 | 4/2001 | Tao et al. | |
| 6,294,830 B1 | 9/2001 | Fjelstad | |
| 6,297,547 B1 | 10/2001 | Akram | |
| 6,339,255 B1 | 1/2002 | Shin | |
| 6,365,966 B1 | 4/2002 | Chen et al. | |
| 6,376,914 B2 | 4/2002 | Kovats et al. | |
| 6,388,313 B1 | 5/2002 | Lee et al. | |
| 6,424,031 B1 | 7/2002 | Glenn | |
| 6,433,418 B1 | 8/2002 | Fujisawa et al. | |
| 6,437,447 B1 | 8/2002 | Huang et al. | |
| 6,448,659 B1 | 9/2002 | Lee | |
| 6,458,609 B1 | 10/2002 | Hikita et al. | |
| 6,462,422 B2 | 10/2002 | Huang | |
| 6,462,424 B1 | 10/2002 | Seki et al. | |
| 6,476,474 B1 | * 11/2002 | Hung | 257/686 |
| 6,498,391 B1 | * 12/2002 | Huang et al. | 257/676 |
| 6,518,659 B1 | 2/2003 | Glenn | |
| 6,563,205 B1 | 5/2003 | Fogal et al. | |

* cited by examiner

SEMICONDUCTOR DEVICE

BACKGROUND OF THE INVENTION

1. Field of the Invention

The present invention relates to a semiconductor device and a method of manufacturing the semiconductor device. Specifically, the invention relates to a semiconductor device with densely stacked semiconductor chips and a manufacturing method thereof.

2. Description of the Background Art

Most conventional methods of mounting a semiconductor chip(s) have employed die bonding of one semiconductor chip to a single lead frame. Referring to FIG. 36, a semiconductor chip 101 is attached directly onto a die pad 103 integrated with a lead frame by means of adhesive or double-faced tape. A terminal electrode (not shown) of the semiconductor chip and a lead terminal 104 are connected by a wire 105 and they are further encapsulated by an encapsulating resin for the purpose of protection from moisture, impact and the like. Although this type of semiconductor device can be manufactured in a simple manner and its many advantages have been proved, it has a problem of a low ratio of the semiconductor chip relative to a unit volume in which the semiconductor chip is housed.

Accordingly, as shown in FIG. 37, a semiconductor device has been proposed including two stacked semiconductor chips 101a and 101b (Japanese Patent Laying-Open No. 2000-156464). This semiconductor device includes a lower semiconductor chip 101b attached to one frame 104a by adhesive 107 and an upper semiconductor chip 101a attached to the other frame 104b. The semiconductor chips are further bonded to each other by adhesive 107. Respective terminal electrodes (not shown) of the semiconductor chips and lead terminals (not shown) are connected by means of wires (not shown) and encapsulated by an encapsulating resin 106. In plan view, the semiconductor chips of the semiconductor device shown in FIG. 37 mostly overlap one another with a small displacement therebetween. In this way, the semiconductor device shown in FIG. 37 achieves a dramatic densification as compared with the semiconductor device shown in FIG. 36.

Through never-ending progress in downsizing of semiconductor chips, a semiconductor chip is now almost thinner than a lead frame. Such semiconductor chips have become highly dense, while densification of a semiconductor device mounting these semiconductor chips is insufficient. In particular, current semiconductor devices are not thin enough as thinning thereof has rarely received attention. Then, with a rapid prevalence of mobile data terminals like mobile phones, digital cameras, video camera and the like, there arise strong demands for downsizing and densification in consideration of the thickness of a semiconductor device. Downsizing and densification of a semiconductor device with its thickness reduced without an increase in area would provide desirable effects not only in such uses as mentioned above but in many other uses.

SUMMARY OF THE INVENTION

The present invention aims to provide a semiconductor device and a manufacturing method thereof achieving downsizing and densification by reducing the thickness of the semiconductor device without increase in area.

According to a first aspect of the present invention, a semiconductor device has terminal electrodes arranged, in plan view, outside a region where semiconductor chips are arranged. The semiconductor device includes a lower semiconductor chip located to overlap in the range of height with the terminal electrodes, an upper semiconductor chip located above the lower semiconductor chip, a wire connecting the upper and lower semiconductor chips to the terminal electrodes, and an encapsulating resin encapsulating the upper and lower semiconductor chips and the wire. The encapsulating resin and the terminal electrodes have respective bottom surfaces coplanar with each other.

The semiconductor chips and the terminal electrodes are arranged so that the terminal electrodes do not increase the thickness of the semiconductor device by their full thickness dimension. Namely, the thickness of terminal electrodes does not affect the thickness of the semiconductor device or merely a part thereof adds the thickness of the semiconductor device. It is thus possible to make the semiconductor device thinner regardless of the thickness of a lead frame where the terminal electrodes are formed. Consequently, downsizing and densification of products such as mobile data terminal can be promoted. Further, as the bottom surfaces of the encapsulating resin and terminal electrodes are coplanar, the terminal electrodes can be affixed onto an adhesive tape to form the semiconductor device having the above-described structure and use the adhesive tape as an outer surface of the encapsulating resin serving also as a resin-leak-prevention sheet thereby accomplishing resin encapsulation, for example. In this way, manufacture can be simplified.

Regarding the semiconductor device according to the first aspect of the invention, the upper semiconductor chip may be supported by a die pad portion coplanar with the terminal electrodes and the lower semiconductor chip may be arranged without overlapping in plan view with the die pad portion, for example.

This structure enables the upper semiconductor chip to firmly be supported. The upper semiconductor chip together with the die pad portion may be bonded to the lower semiconductor chip. Alternatively, the upper and lower semiconductor chips may be separated to fill the space between the chips with the encapsulating resin. Here, "support" means that the chip is supported by the die pad portion by adhering them together using adhesive, die bonding material or the like.

Regarding the semiconductor device according to the first aspect of the invention, the lower semiconductor chip and the encapsulating resin may have respective bottom surfaces coplanar with each other and the bottom surface of the lower semiconductor chip may be exposed from the encapsulating resin, for example.

With this structure, it is possible, for example, to affix the lower semiconductor chip together with the terminal electrodes onto an adhesive tape so as to fabricate the semiconductor device, so that manufacture is simplified. Further, the lower semiconductor chip only may be used to support the upper semiconductor chip to eliminate the die pad portion, reducing a manufacturing cost.

Regarding the semiconductor device according to the first aspect of the invention, the upper semiconductor chip may be supported by a die pad portion located higher than the terminal electrodes, and the lower semiconductor chip may have its bottom surface encapsulated by the encapsulating resin, for example.

With this structure, the lower semiconductor chip is supported such that it suspends from the upper semiconductor chip supported by the die pad portion, and accordingly the lower semiconductor chip can be arranged inwardly spaced from the bottom surface of terminal electrodes. The lower semiconductor chip is thus encapsulated by the encapsulating resin to enable the entire semiconductor device to be protected from moisture, direct impact and the like.

The semiconductor device according to the first aspect of the invention is of QFN (Quad Flat Non-Lead Package) type having the terminal electrodes arranged outside to surround the semiconductor chips, for example.

The terminal electrodes arranged to surround the semiconductor chips and the semiconductor chips and the electrodes are nearly located. Consequently, wiring of the electrodes and chips becomes simplified. Then, there is a higher degree of freedom for partially overlapping two semiconductor chips.

Regarding the semiconductor device according to the first aspect of the invention, the upper and lower semiconductor chips may be rectangles respectively in shape, connection terminals of the semiconductor chips may be arranged along shorter sides opposing each other of the rectangles, and the upper and lower semiconductor chips being rectangles in shape may be arranged to cross each other in plan view, for example.

Connection terminals are thus distributed over four sides so that wires on the semiconductor chips are not closely located in space and never interfere with each other. In particular, for the QFN type semiconductor device with terminal electrodes surrounding the chips, the connection terminals arranged on four sides and the surrounding terminal electrodes can neatly be connected with short wires.

Regarding the semiconductor device according to the first aspect of the invention, the terminal electrodes arranged outside may be leads arranged along two opposing sides with the semiconductor chips therebetween, for example.

This structure can be used to manufacture a thin TSOP type semiconductor device in a simple manner easily, with manufacturing cost reduced by enhancement of efficiency and yield.

According to a second aspect of the invention, a semiconductor device is of TSOP (Thin Small Outline Package) type having semiconductor chips arranged between a first lead portion and a second lead portion provided respectively on two sides opposing in plan view. The semiconductor device includes a first die pad portion integrated with and noncoplanar with the first lead portion and located higher relative to a reference plane passing through central position between the highest surface and the lowest surface of the first and second lead portions, a second die pad portion integrated with and noncoplanar with the second lead portion and located lower relative to the reference plane, and a lower semiconductor chip supported by the first die pad portion and an upper semiconductor chip supported by the second die pad portion. The two semiconductor chips are partially-overlapped and located to overlap in the range of height with the first and second lead portions.

The semiconductor chips and the terminal electrodes are arranged so that the terminal electrodes do not increase the thickness of the semiconductor device by their full thickness dimension. Namely, the thickness of the lead frame does not affect the thickness of the semiconductor device or merely a part thereof adds the thickness of the semiconductor device. It is thus possible to make the semiconductor thinner. Further, components are arranged symmetrically in the vertical direction with respect to the reference plane and accordingly thermal stress and residual stress are not likely to be uneven in the vertical direction. Then, distortion like warp and the like rarely occurs. The upper and lower semiconductor chips may be bonded or may be spaced with an encapsulating resin filling the gap therebetween. It is noted that "support" means that the die pad portion is directly bonded to one of the bonded semiconductor chips to support the chip, and means, from an all-round and dynamical point of view, that the two die pad portions cooperate to eventually support both semiconductor chips. The reference plane is in parallel with planes that constitute the lead portions.

Regarding the semiconductor device according to the second aspect of the invention, the first die pad portion may be provided to a first lead frame located including the first lead portion above the reference plane, and the second die pad portion may be provided to a second lead frame located including the second lead portion below the reference plane, for example.

With this structure, two stacked lead frames can be employed to manufacture a semiconductor device. Two semiconductor chips can thus be stacked readily and efficiently on the two lead frames.

Regarding the semiconductor device according to the second aspect of the invention, for example, the first die pad portion may be L-shaped including a first extension extending from an end of the first lead portion toward the second lead portion and a first opposing portion continuing from the first extension and extending in parallel with the first lead portion. The second die pad portion may be arranged in plan view opposite the first die pad portion and L-shaped including a second extension extending from an end of the second lead portion toward the first lead portion and a second opposing portion continuing from the second extension and extending in parallel with the second lead portion. The first extension and the first opposing portion may have their bottom surface supporting the lower semiconductor chip and the second extension and the second opposing portion may have their upper surface supporting the upper semiconductor chip.

Such L-shaped die pad portions can be used to manufacture a thin and dense semiconductor device efficiently.

Regarding the semiconductor device according to the second aspect of the invention, the first and second lead portions and the first and second die pad portions may be integrated into a common lead frame, the reference plane passing through center of thickness of the lead frame, the first die pad portion may support the lower semiconductor chip of the partially overlapped semiconductor chips, and the second die pad portion may support the upper semiconductor chip, for example.

This simple and plain structure can be produced with high yield and efficiency as well as an earlier delivery. In addition, as components are arranged symmetrically in the vertical direction with respect to the reference plane, warp caused by thermal strain, residual stress and the like is unlikely to occur.

Regarding the semiconductor device according to the second aspect of the invention, center of thickness of the first die pad portion and center of thickness of the second die pad portion are preferably spaced vertically from the reference plane in respective directions opposite to each other, each by a distance equal to the sum of a half of thickness of the lead frame and a half of thickness of an adhesive layer bonding the upper and lower semiconductor chips, for example.

A precise symmetry relative to the reference plane is thus maintained to achieve a great resistance to warp and the like described above.

According to the first aspect of the invention, a method of manufacturing a semiconductor device having terminal electrodes arranged, in plan view, outside a region where semiconductor chips are arranged, includes, an affix-onto-sheet step of affixing the terminal electrodes and a lower semiconductor chip onto an adhesive sheet, a semiconductor chip stacking step of bonding an upper semiconductor chip onto the lower semiconductor chip, a wire connecting step of connecting the lower and upper semiconductor chips respectively to the terminal electrodes by wires, a resin encapsulating step of encapsulating the terminal electrodes, lower semiconductor chip, upper semiconductor chip and wires arranged on the adhesive sheet by resin, and an adhesive sheet stripping step of stripping the adhesive sheet from components resin-encapsulated in the resin encapsulating step.

With this structure, the adhesive sheet on which the terminal electrodes and semiconductor chips are arranged can be used as a sheet for preventing resin leakage and forming the outer surface of encapsulating resin. Then, the thickness of terminal electrodes does not add the thickness of the semiconductor device or just partially adds the thickness of the semiconductor chip. A resultant thin semiconductor device can accordingly be manufactured simply and with a low cost.

Regarding the method of manufacturing a semiconductor device according to the first aspect of the invention, a die pad portion may be affixed onto the sheet together with the terminal electrodes and lower semiconductor chip in the affix-onto-sheet step to bond the upper semiconductor chip to the die pad portion in the semiconductor chip stacking step, for example.

The upper semiconductor chip in this structure is supported by the die pad portion so that the lower semiconductor chip can be positioned with a greater degree of freedom. Specifically, the lower semiconductor chip supported by an adhesive tape in course of manufacture may be exposed on the bottom surface after the manufacture. Alternatively, the lower semiconductor chip may be supported by being suspended from the upper semiconductor chip. Consequently, the lower semiconductor chip is spaced inward from the bottom surface and the outer surface is formed by the encapsulating resin and thus the structure resistant to moisture and impact can be achieved.

Regarding the method of manufacturing a semiconductor device according to the first aspect of the invention, only the terminal electrodes and a die pad portion may be affixed onto the adhesive sheet in the affix-onto-sheet step to bond the upper semiconductor chip to the die pad portion in the semiconductor chip stacking step, the upper semiconductor chip and lower semiconductor chip being bonded in advance to constitute stacked semiconductor chips, for example.

This manufacturing method may be used to position the lower semiconductor chip spaced inward from the bottom surface.

Regarding the method of manufacturing a semiconductor device according to the first aspect of the invention, only the lower semiconductor chip may be affixed onto the adhesive sheet in the affix-onto-sheet step to affix a die pad portion to which the upper semiconductor chip is bonded in advance onto the adhesive sheet together with the terminal electrodes, for example.

According to conditions of manufacture sites, thin semiconductor devices can efficiently be produced by using this manufacturing method. The upper and lower semiconductor chips may be bonded with adhesive or spaced with the gap therebetween filled with the encapsulating resin.

A method of manufacturing a semiconductor device according to the second aspect of the invention includes: a lead frame stacking step of stacking a first lead frame on a second lead frame, the first lead frame including a first lead portion and a first die pad portion extending in L-shape from an end of the first lead portion along periphery of a region where a lower semiconductor chip is arranged, the second lead frame including a second lead portion and a second die pad portion opposing the first die pad portion in plan view and extending in L-shape from an end of the second lead portion along periphery of a region where an upper semiconductor chip is arranged, the first and second lead portions opposing in plan view with the upper and lower semiconductor chips therebetween; a semiconductor chip bonding step of bonding the lower semiconductor chip to the first die pad portion and bonding the upper semiconductor chip to the second die pad portion; a welding step of welding together the first lead frame and the second lead frame at their overlapping portion; a wire bonding step of connecting the upper and lower semiconductor chips to a terminal electrode by a wire; a resin encapsulating step of encapsulating by means of a resin a region inside the overlapping portion being welded; and a cutting off step of cutting off a portion outside the resin encapsulated first and second lead portion and the upper and lower semiconductor chips in the resin encapsulating step.

This manufacturing method enables a thin and dense semiconductor device to be produced efficiently by using two lead frames and welding.

Regarding the method of manufacturing a semiconductor device according to the second aspect of the invention, sub steps of the lead frame stacking step and sub steps of the semiconductor chip bonding step are preferably combined and partially changed in their order to be performed, for example.

Depending on manufacture sites, it could be efficient to preliminarily bond a semiconductor chip to one die pad portion in the lead frame stacking step. Such a change in order of sub steps is preferably made over the main steps, not just in one main step as described above.

Regarding the method of manufacturing a semiconductor device according to the second aspect of the invention, the lead frame stacking step and the semiconductor chip bonding step may include as a whole a die bonding material arranging step of arranging a die bonding material bonding the upper and lower semiconductor chips to the first and second die pad portions, for example.

The die bonding material is desirably employed instead of adhesive with a high flowability since it inevitably occurs that one of the lead frames is caused to face downward or both lead frames are tilted. A manufacturing process can thus be constituted to provide a high stability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in conjunction with the drawings.

(First Embodiment)

Figure 1:
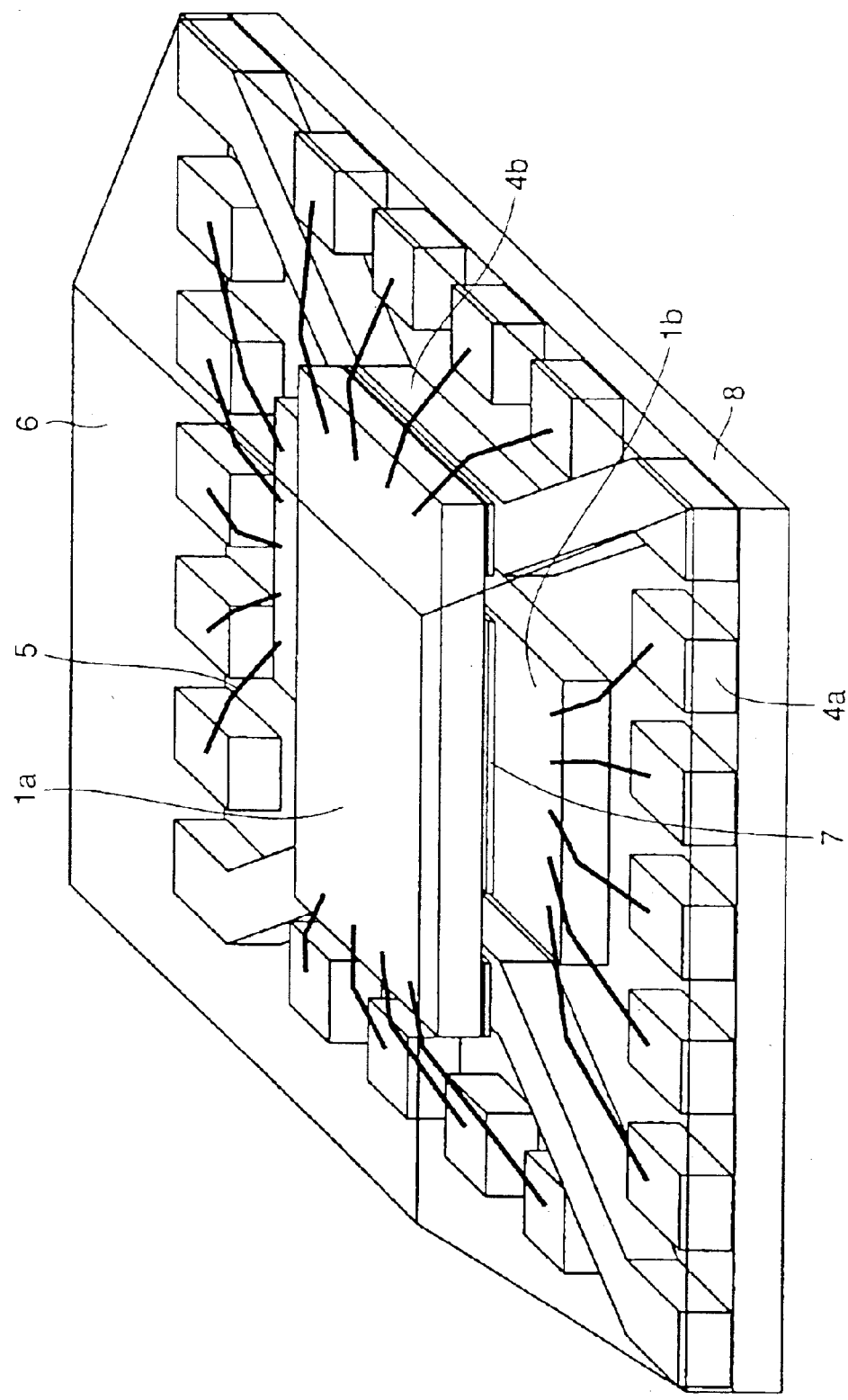
FIG. 1 is a schematic perspective view showing a semiconductor device according to a first embodiment of the present invention.

Referring to FIG. 1, a semiconductor device shown still has an adhesive sheet 8 used in manufacturing thereof that should be stripped off. In FIG. 1, a die pad 4b, a lead 4a as a terminal electrode, and a lower semiconductor chip 1b are in contact with the upper surface of adhesive sheet 8. It is noted that lead 4a should be arranged having contact with adhesive sheet 8 while die pad 4b may be in contact with the adhesive sheet or located above and separated from the adhesive sheet. Die pad 4b and lead 4a are identical in thickness and can be formed through stamping or the like from one sheet. An upper semiconductor chip 1a is arranged having contact with adhesive 7 on lower semiconductor chip 1b as well as adhesive 7 on die pad 4b. Respective connection terminals (not shown) of upper and lower semiconductor chips 1a and 1b are connected to leads 4a by wires 5 to provide a predetermined wiring. Encapsulating resin 6 secures and covers entirely these chips, terminals and wires except for the portion contacting the adhesive sheet for protecting them from moisture and external force.

(Manufacturing Method A)

Figure 2:
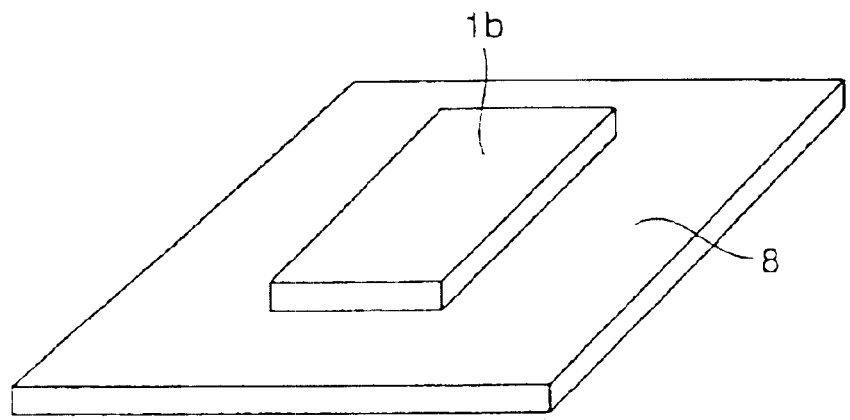
FIG. 2 is a perspective view showing the semiconductor device in FIG. 1 in a stage of manufacturing method A with a lower semiconductor chip affixed to an adhesive sheet.
Figure 3:
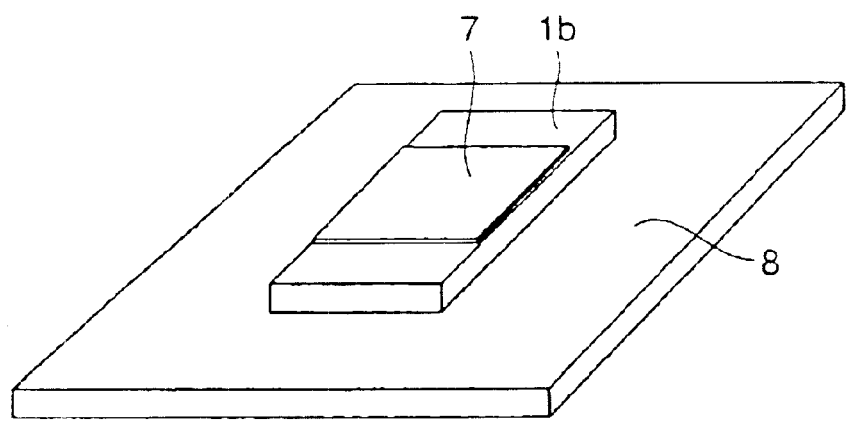
FIG. 3 is a perspective view of the semiconductor device in a following stage relative to the state in FIG. 2 with adhesive applied to a predetermined region of the semiconductor chip.
Figure 4:
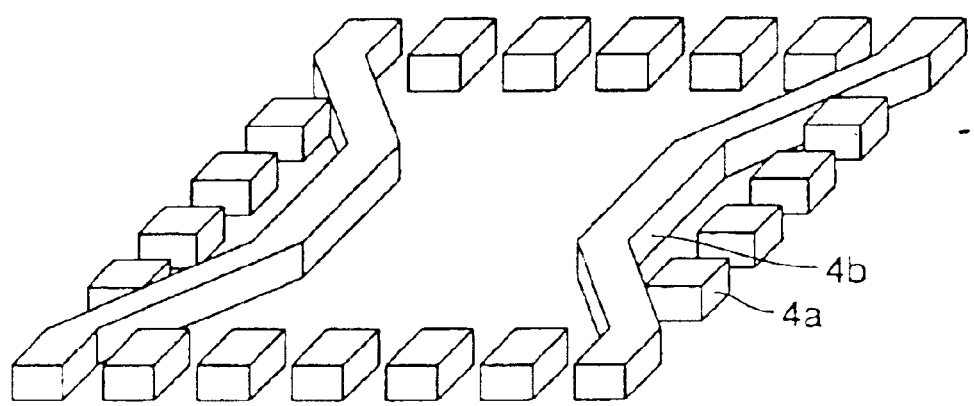
FIG. 4 is a perspective view of a lead frame having a lead and a die pad in a separate stage from those in FIGS. 2 and 3.
Figure 5:
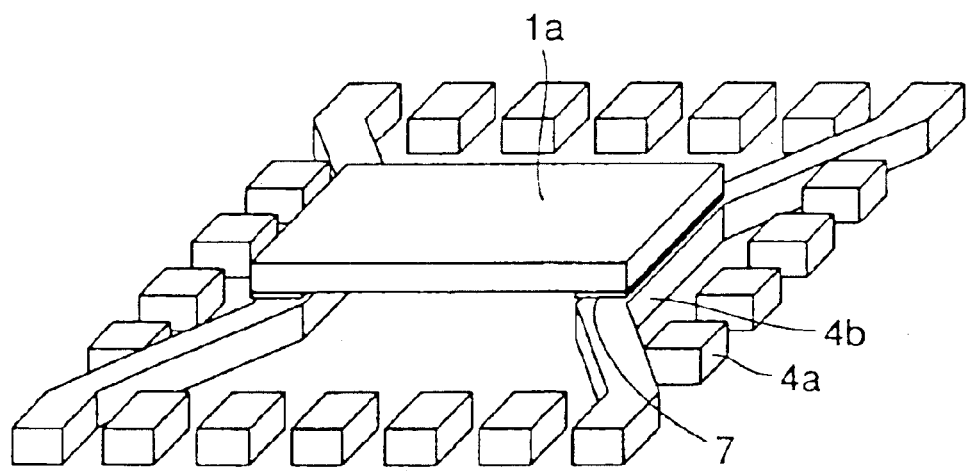
FIG. 5 is a perspective view of the semiconductor device in a stage having an upper semiconductor chip attached onto the die pad in FIG. 4.
Figure 6:
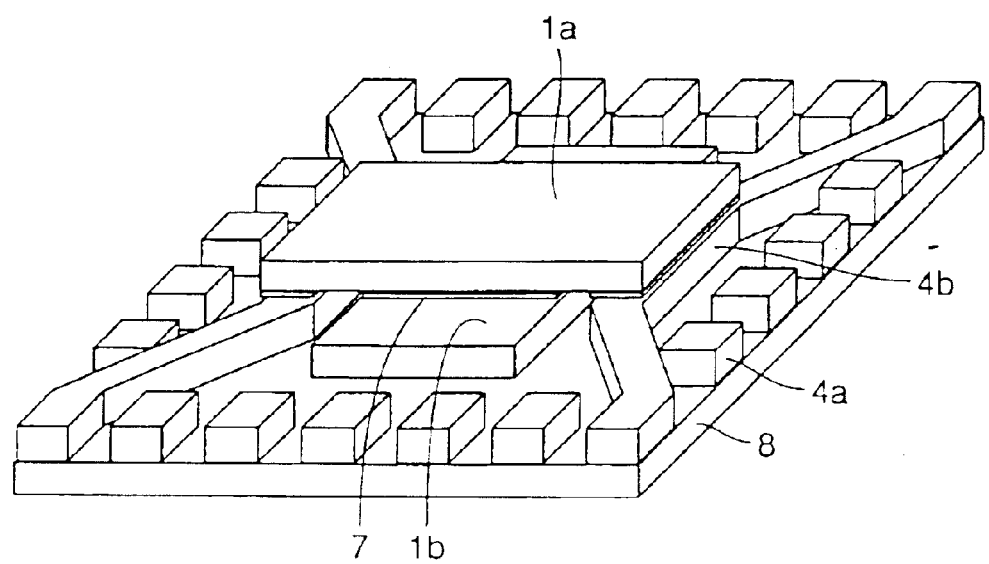
FIG. 6 is a perspective view of the semiconductor device having the upper semiconductor chip in FIG. 5 bonded to be located above and cross the lower semiconductor chip in FIG. 3.

Manufacturing method A of the semiconductor device shown in FIG. 1 is described. Referring to FIG. 2, lower semiconductor chip 1b is affixed to adhesive sheet 8. Then, as shown in FIG. 3, adhesive 7 is applied to a predetermined region on semiconductor chip 1b. Referring to FIG. 4, in a separate flow from that shown through FIGS. 2 to 3, a lead frame including die pad 4b and lead 4a is affixed to adhesive sheet 8, adhesive 7 is applied onto die pad 4b, and upper semiconductor chip 1a is put thereon to be secured thereto. Then, upper semiconductor chip 1a in FIG. 5 is aligned with respect to adhesive 7 in FIG. 3 such that upper semiconductor chip 1a is positioned on and secured to adhesive 7, and lead 4a and die pad 4b are then affixed to adhesive sheet 8 (FIG. 6). Through subsequent steps (not shown), respective connection terminals of upper semiconductor chip 1a and lower semiconductor chip 1b are coupled by wires to be encapsulated by means of an encapsulating resin and each component is fixed. Then, the adhesive sheet is peeled off. According to the first embodiment, the adhesive sheet is stripped off to expose the lead, the die pad and the lower semiconductor chip.

(Manufacturing Method B)

Figure 7:
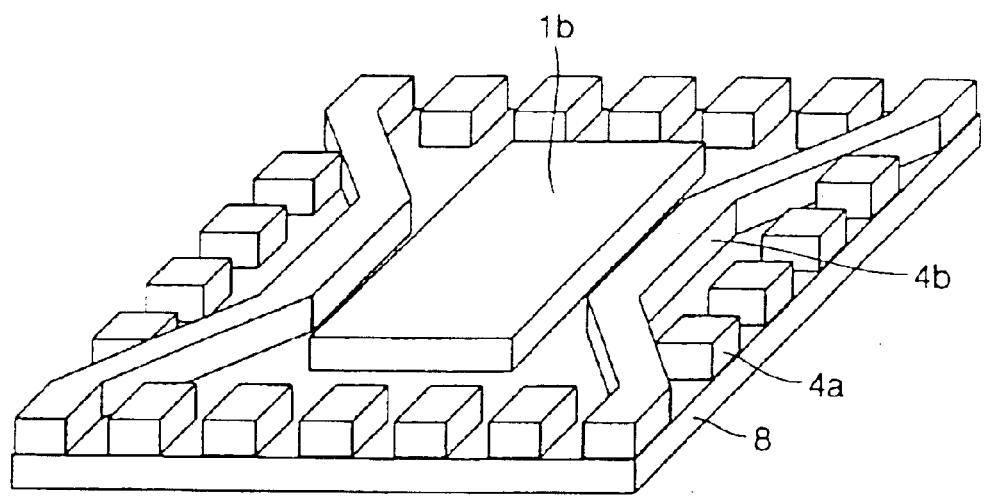
FIG. 7 is a perspective view of the semiconductor device in FIG. 1 in a stage of manufacturing method B with the lead frame and lower semiconductor chip bonded onto the adhesive sheet.
Figure 8:
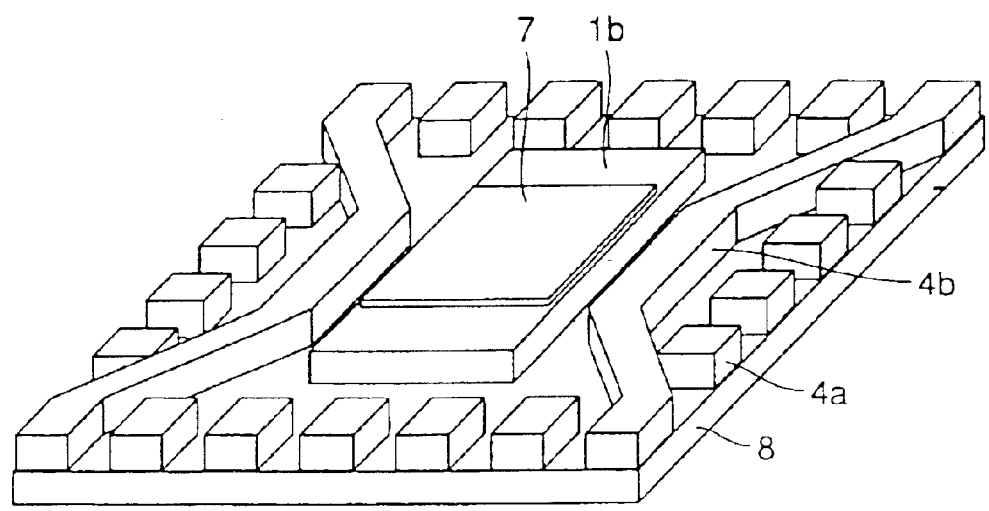
FIG. 8 is a perspective view of the semiconductor chip in the state in FIG. 7 with a predetermined region to which adhesive is applied.

A modification of manufacturing method A discussed above, namely manufacturing method B is now described. Referring to FIG. 7, a lead frame including a lead 4a and a die pad 4b as well as a lower semiconductor chip 1b are affixed to an adhesive sheet 8. The semiconductor chip to which this embodiment is applied has its thickness almost identical to or smaller than that of the lead frame as described above, so that the top surface of semiconductor chip 1b is nearly at the same height as, or lower than, that of lead 4a and die pad 4b shown in FIG. 7. Referring to FIG. 8, adhesive 7 is applied with an appropriate thickness onto a predetermined region of the top surface of lower semiconductor chip 1b as well as the top surface of the die pad. An upper semiconductor chip 1a is put on the adhesive to be fastened, producing an intermediate product having the structure shown in FIG. 6. Subsequent wiring and resin encapsulation steps are the same as those of manufacturing method A.

(Structural Detail)

Figure 9:
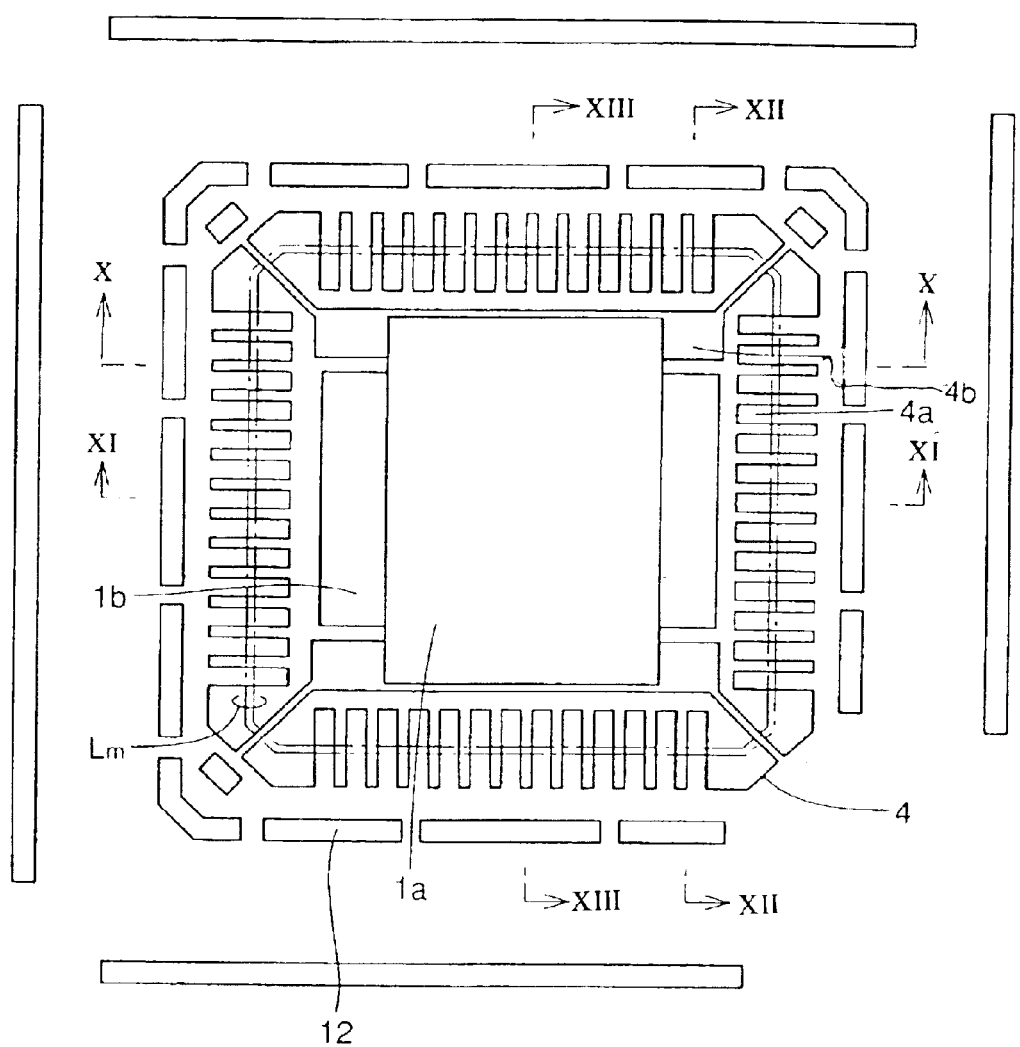
FIG. 9 is a plan view showing the semiconductor device in FIG. 1 together with a surrounding lead frame that is in course of manufacture according to the first embodiment.
Figure 10:
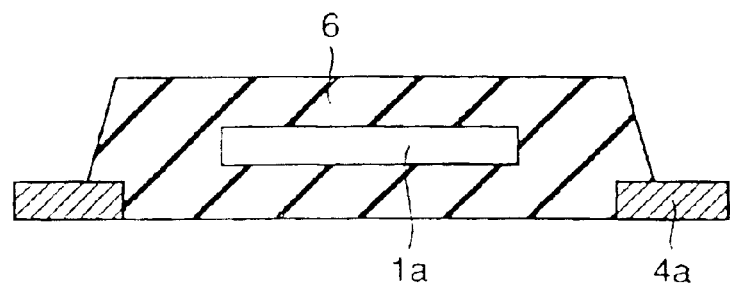
FIGS. 10, 11, 12, and 13 respectively show cross sections along lines X—X, XI—XI, XII—XII, and XIII—XIII in FIG. 9.
Figure 11:
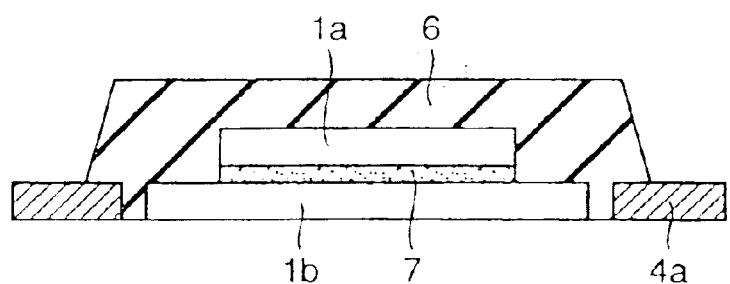
Figure 12:
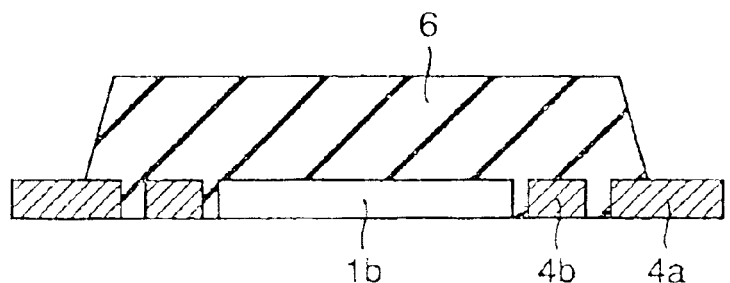
Figure 13:
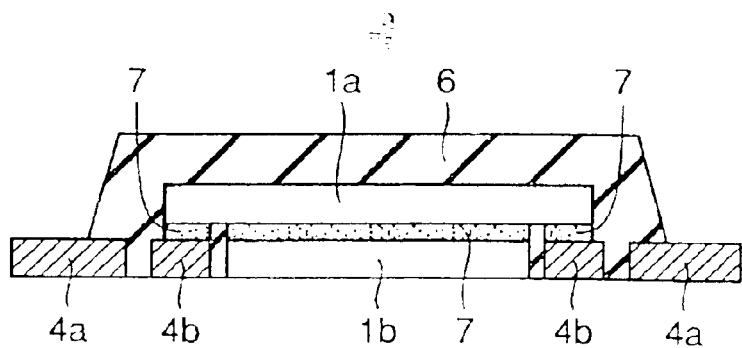
Figure 14:
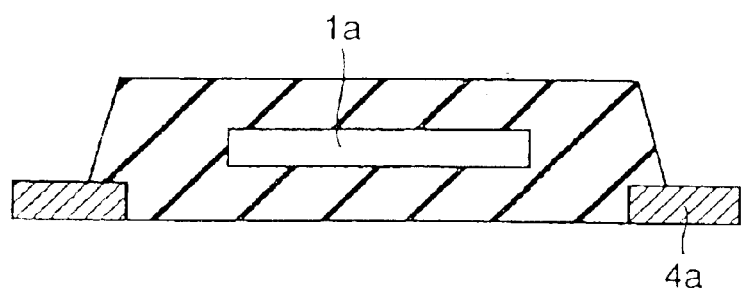
FIGS. 14, 15, 16, and 17 respectively show cross sections of a semiconductor device according to a first modification of the first embodiment of the present invention corresponding to respective cross sections along lines X—X, XI—XI, XII—XII, and XIII—XIII in FIG. 9.
Figure 15:
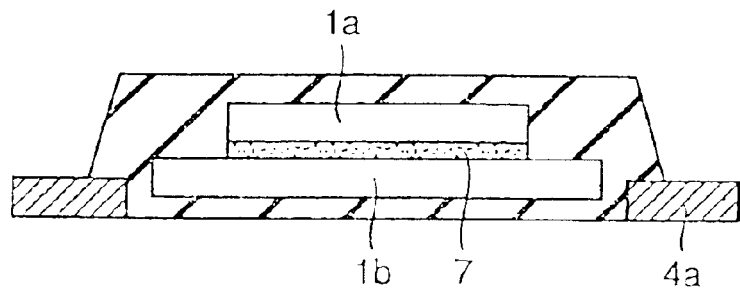
Figure 16:
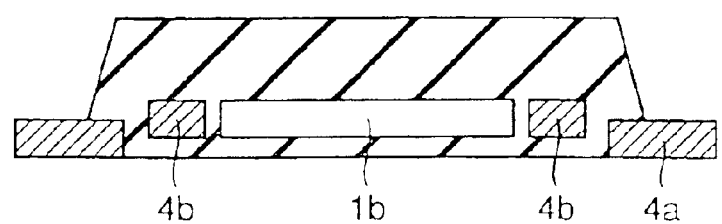
Figure 17:
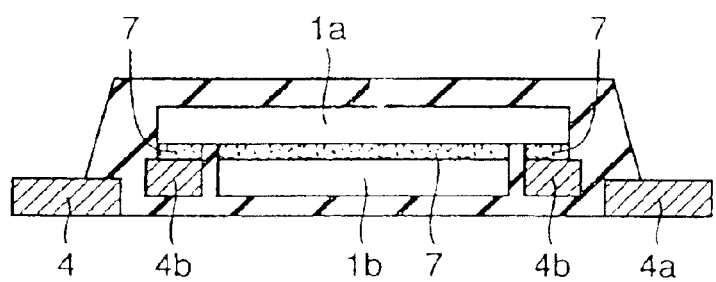
Figure 18:
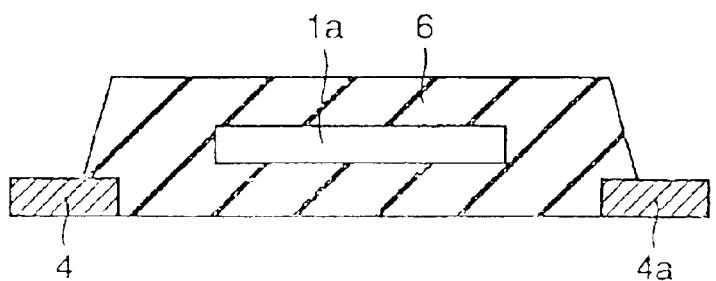
FIGS. 18, 19, 20, and 21 respectively show cross sections of a semiconductor device according to a second modification of the first embodiment of the present invention corresponding to respective cross sections along lines X—X, XI—XI, XII—XII, and XIII—XIII in FIG. 9.
Figure 19:
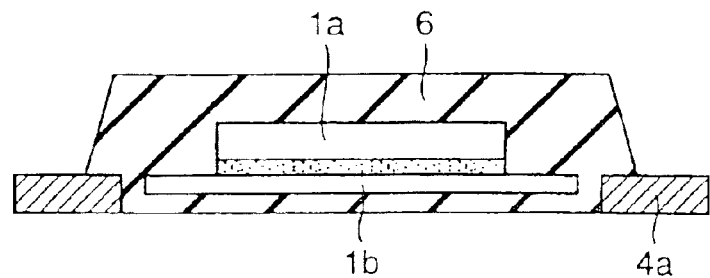
Figure 20:
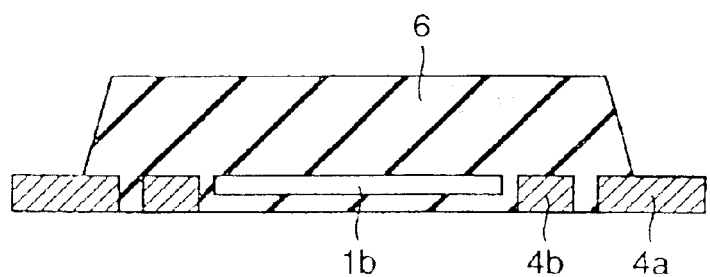
Figure 21:
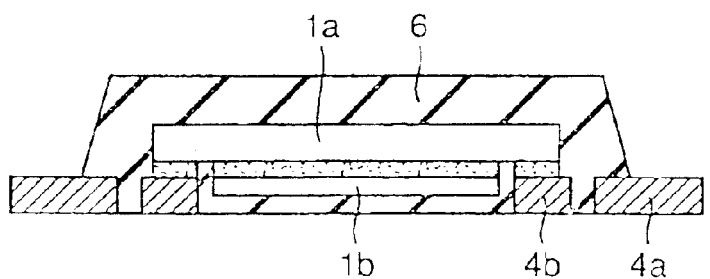

The semiconductor device shown in FIG. 1 is described below in more detail. FIG. 9 is a plan view of the semiconductor device according to the first embodiment that is in course of manufacture including the edge portion of a lead frame 4 before cutting. The double line Lm extending through the middle of leads 4a to surround two semiconductor chips 1a and 1b indicates the outer shape of a mold corresponding to the outer surface of a resin encapsulation. A cutting line for cutting out each semiconductor device is appropriately positioned in a region including the mold line outside the semiconductor device. A slit 12 spaced from the perimeter of leads is made for easily cutting out a semiconductor device. In an actual manufacture by manufacturing method B for example, tape-shaped lead frames and lower semiconductor chips are successively affixed to a tape-shaped adhesive sheet and accordingly respective intermediate products of semiconductor devices are manufactured one after another through a production line.

FIGS. 10, 11, 12, and 13 show respective cross sections along X—X, XI—XI, XII—XII, and XIII—XIII in FIG. 9. Components that are exposed after the adhesive tape is removed are encapsulated and fastened by means of an encapsulating resin. Although FIGS. 10 to 13 show no wire connecting semiconductor chips 1a and 1b with leads 4a, the encapsulating resin has a thickness sufficient to encapsulate wires.

The structure described above houses a semiconductor chip between leads and a semiconductor chip is further arranged thereon to overlap it. Accordingly, it is possible to efficiently reduce the thickness of the semiconductor device without increasing area.

(First Modification)

A first modification of the first embodiment according to the present invention is described below. FIGS. 14, 15, 16, and 17 respectively show cross sections of a semiconductor device corresponding to those along respective lines X—X, XI—XI, XII—XII, and XIII—XIII in FIG. 9. In the first modification, a die pad 4b is processed such that it is shifted upward slightly. Naturally, according to the upward shifting of the die pad, upper and lower semiconductor chips 1a and 1b are both shifted upward. Other components are identical in structure to those of the first embodiment. An encapsulating resin thus extends under lower semiconductor chip 1b. Therefore, when an adhesive sheet is removed, lower semiconductor chip 1b and die pad 4b are never exposed on the rear side.

The semiconductor device of the first modification is manufactured in the following way. In the stage shown in FIG. 7 of manufacturing method B explained above, lower semiconductor chip 1b is not affixed to adhesive sheet 8 and only a lead frame including lead 4a and die pad 4b is affixed to the adhesive sheet. Upper and lower semiconductor chips 1a and 1b are then crossed and bonded with adhesive so as to integrate them in advance. The upper chip of the integrated semiconductor chips is placed on the die pad to which adhesive is applied, and fastened to the die pad.

Although the semiconductor device of the first modification has its thickness which is not so remarkably reduced compared with the semiconductor device in FIGS. 10 to 13, the former semiconductor device is advantageous in that a more extensive protection from moisture and outer force is possible since the semiconductor chip is not exposed on the rear side.

(Second Modification)

FIGS. 18, 19, 20 and 21 respectively show cross sections of a semiconductor device according to a second modification of the first embodiment, corresponding to those along respective lines X—X, XI—XI, XII—XII, and XIII—XIII in FIG. 9. The second modification is characterized by the difference in thickness between upper and lower semiconductor chips 1a and 1b as compared with the embodiment discussed above. Other components are identical in structure to those of the first modification. A die pad 4b of the second modification is also shifted upward and thus the manufacturing method of the first modification can be applied.

With this structure, the present invention is applicable to any combination of various types of semiconductor chips. Accordingly, many semiconductor devices having a small thickness can be achieved with versatility.

(Second Embodiment)

Figure 22:
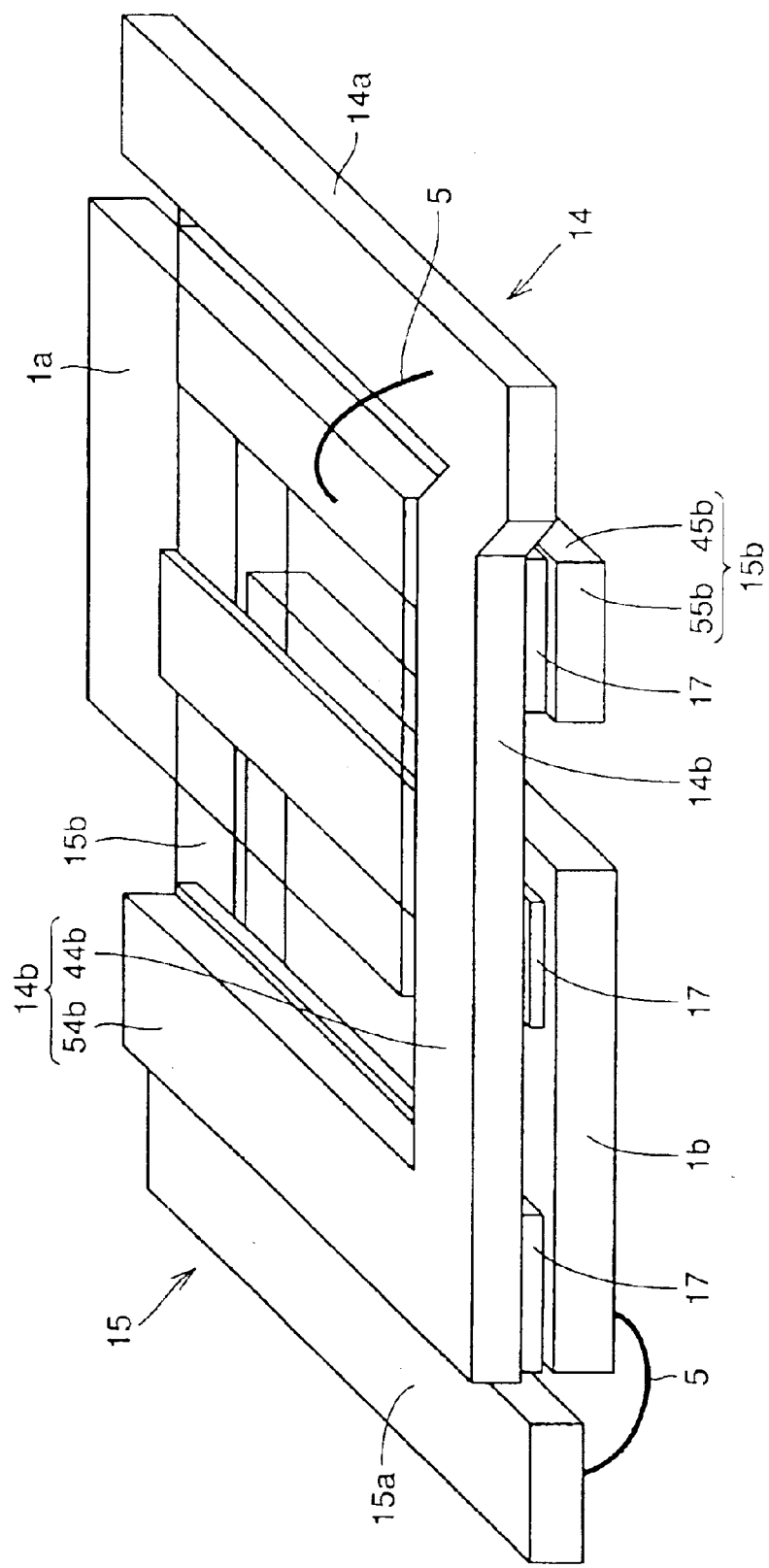
FIG. 22 is a schematic perspective view of a semiconductor device according to a second embodiment of the present invention.

Referring to FIG. 22, lead frames 14 and 15 include lead portions 14a and 15a and die pad portions 14b and 15b. While lead portions 14a and 15a actually have many lead pins, in order to show the entire structure plainly, respective lead pins are not depicted distinguishably. While lead portion 14a and die pad portion 14b are almost coplanar with each other, one of them may be shifted upward or downward. Die pad portion 14b includes an extension 44b and an opposing portion 54b. Die pad portion 15b of lead frame 15 also includes an extension 45b and an opposing portion 55b.

A semiconductor chip 1b is adhered via a die bonding material 17 to die pad portion 14b of the upper lead frame 14 while a semiconductor chip 1a is adhered via die bonding material 17 to die pad portion 15b of the lower lead frame 15. Two semiconductor chips 1a and 1b are thus fastened and further adhered to each other by means of die bonding material 17. A connection terminal (not shown) of the upper semiconductor chip 1a and a lead pin (not shown) of lead portion 14a are connected by a wire 5. These components are entirely encapsulated by an encapsulating resin to protect the components in the semiconductor device from moisture and external force.

Figure 23:
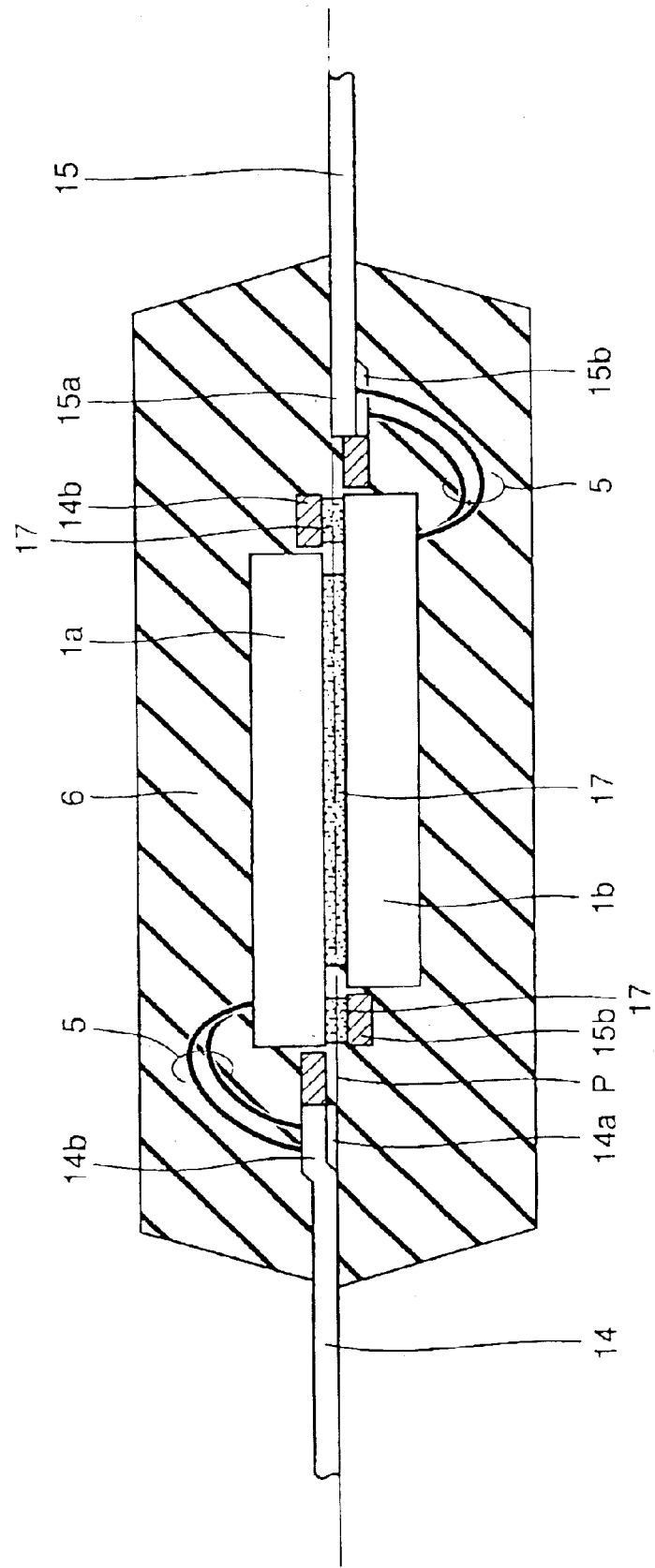
FIG. 23 is a cross sectional view of the semiconductor device according to the second embodiment.

Referring to FIG. 23, die pad portion 14b of the upper lead frame 14 supports the lower semiconductor chip 1b via die bonding material 17 and die pad portion 15b of the lower lead frame 15 supports the upper semiconductor chip 1a via die bonding material 17. Here, a reference plane P passes through respective centers of thicknesses of upper and lower lead frames 14 and 15. One of wires 5 is coupled to die pad portions 14b and 15b for grounding. As shown in FIG. 23, two lead frames are displaced in the vertical direction relative to reference plane P and two overlapping semiconductor chips are arranged between those two lead frames. Consequently, semiconductor chips 1a and 1b and lead frames 14 and 15 do not overlap in plan view and thus the entire thickness is not the combination of respective thicknesses. In this way, the semiconductor device can have a reduced thickness.

Figure 24:
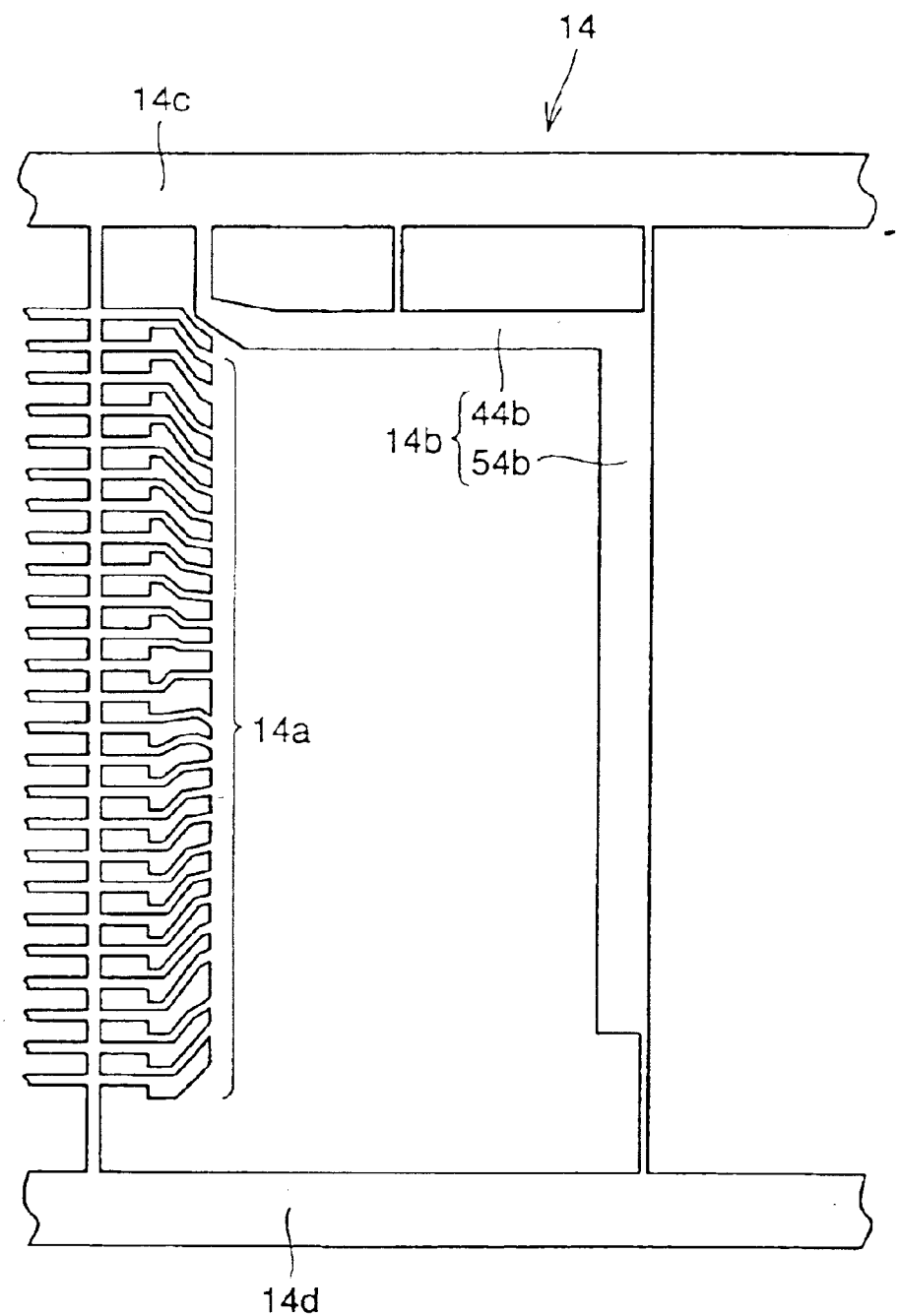
FIG. 24 is a plan view of an upper lead frame in FIG. 22.
Figure 25:
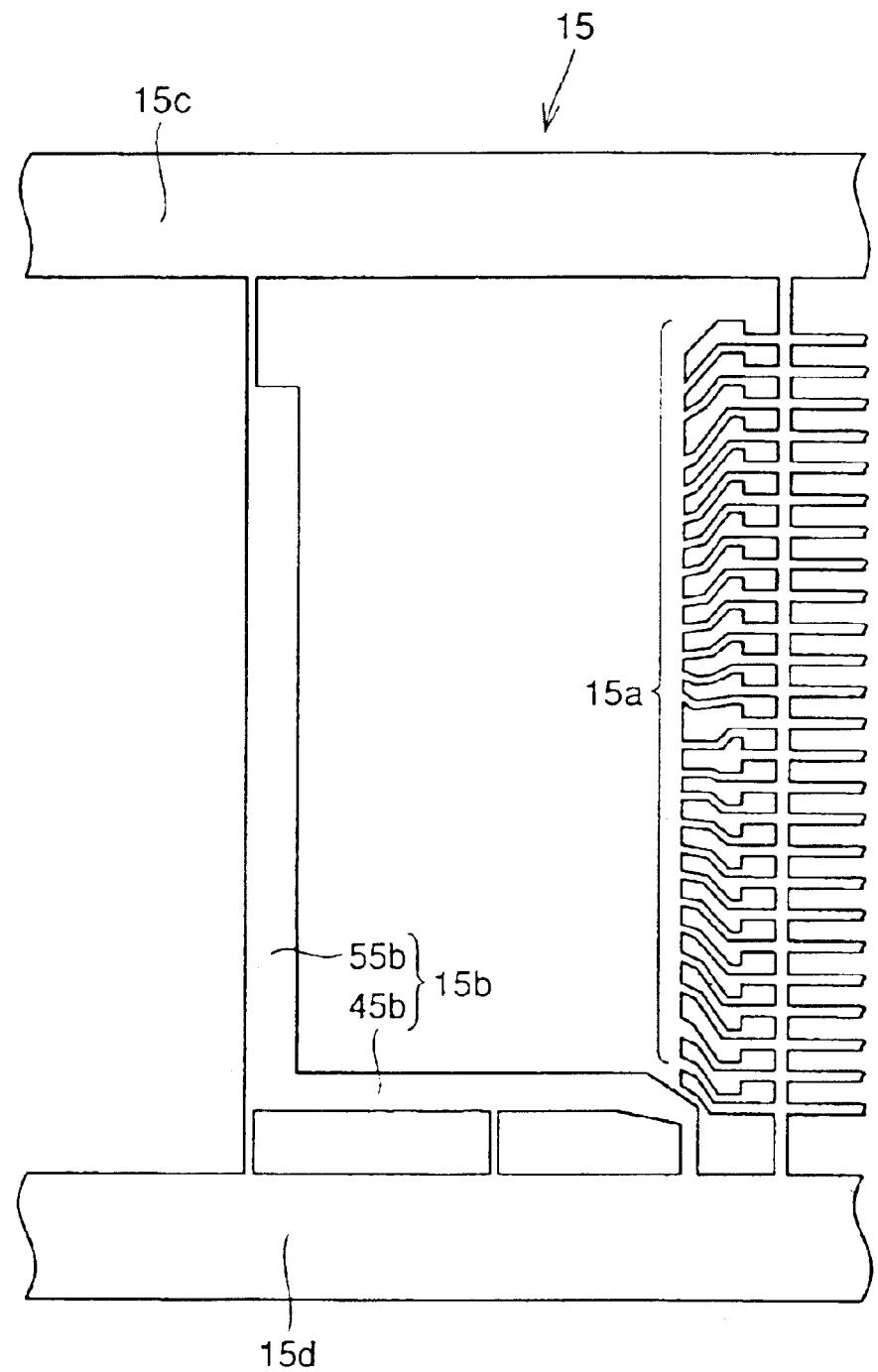
FIG. 25 is a plan view of a lower lead frame in FIG. 22.
Figure 26:
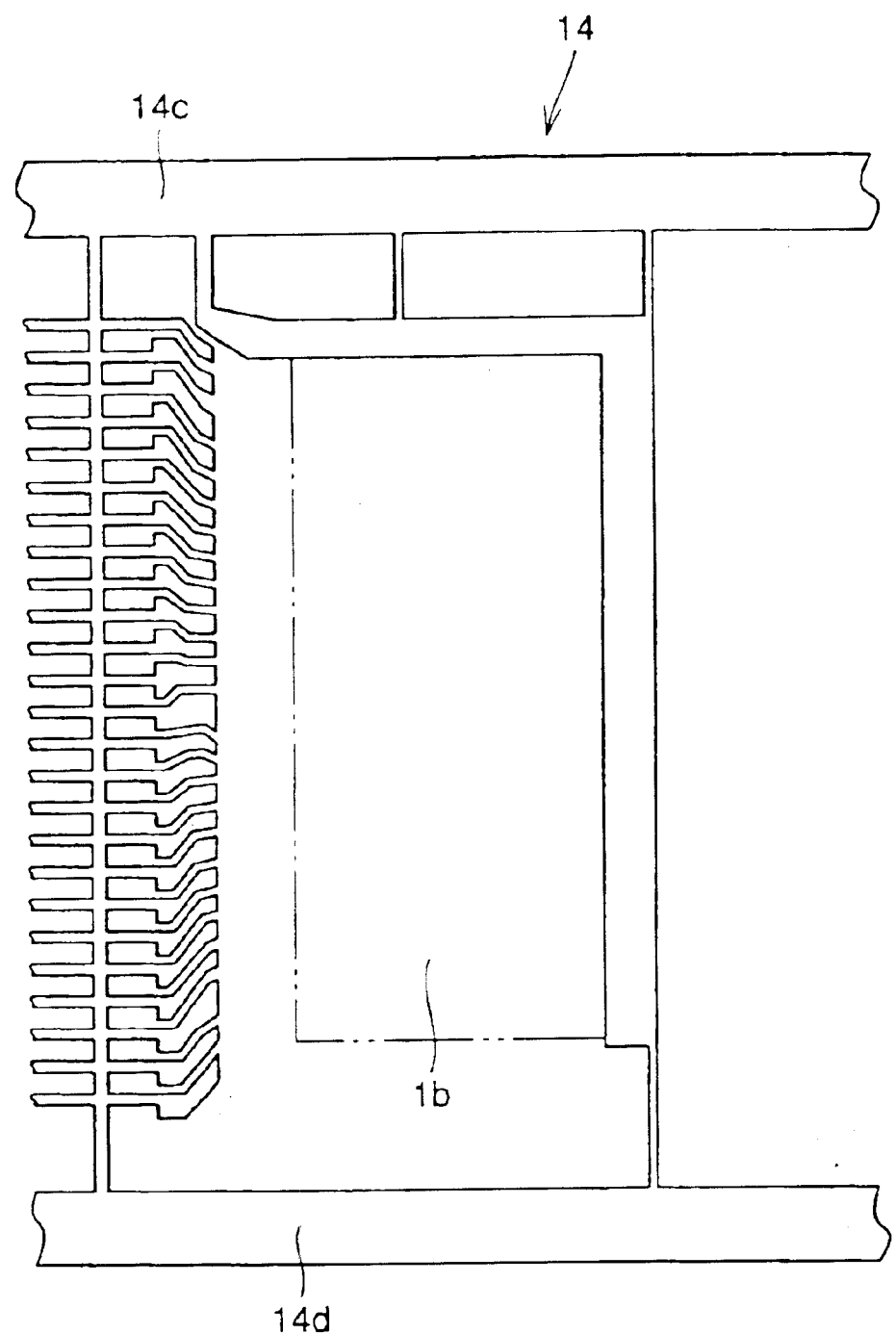
FIG. 26 shows the upper lead frame in FIG. 22 supposing that its die pad portion has its bottom surface to which a lower semiconductor chip is attached.
Figure 27:
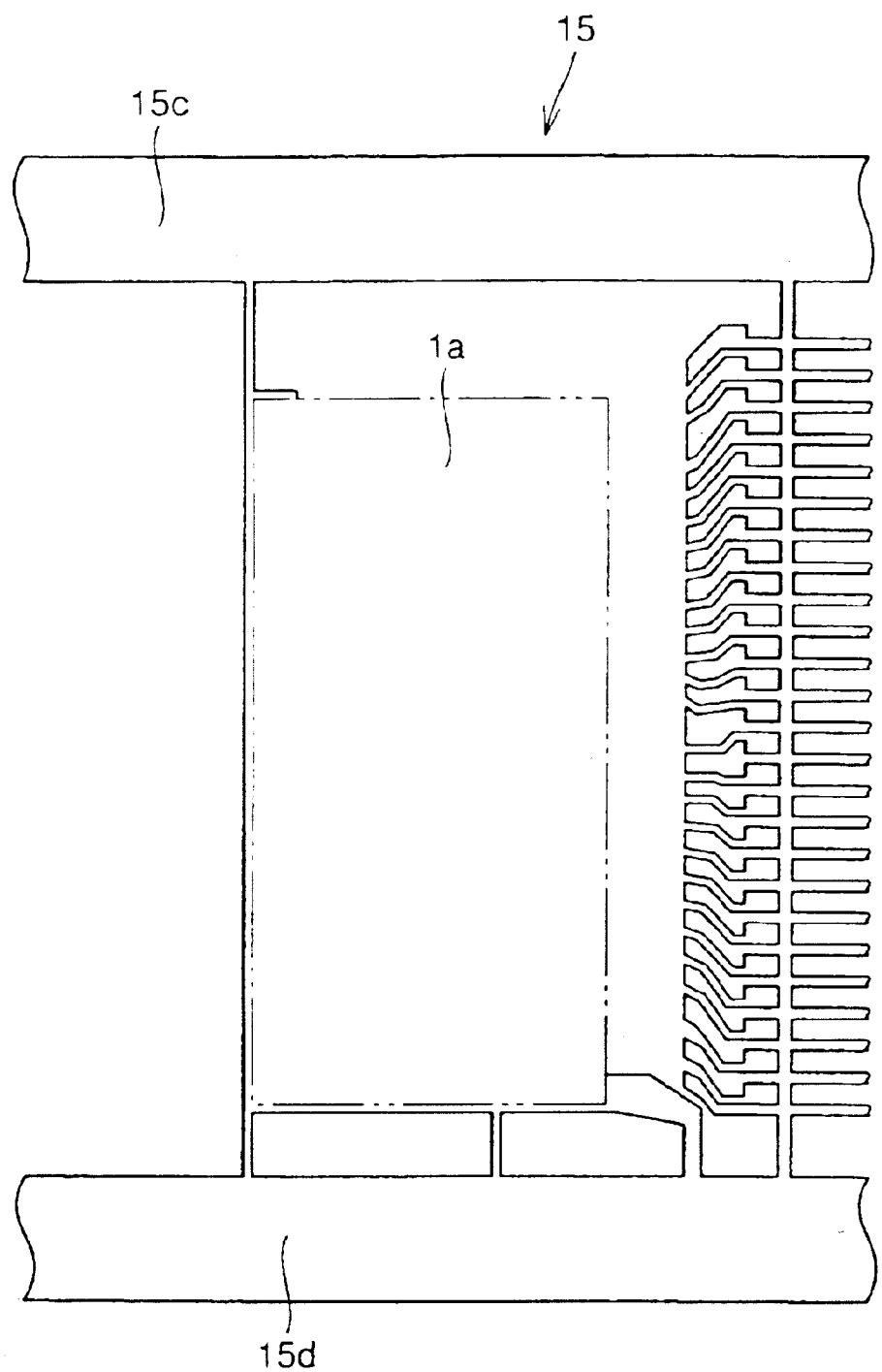
FIG. 27 shows the lower lead frame in FIG. 22 supposing that its die pad portion has its upper surface to which an upper semiconductor chip is attached.

A method of manufacturing the semiconductor device shown in FIGS. 22 and 23 is described. FIGS. 24 and 25 show upper and lower lead frames 14 and 15 respectively. Lead portions 14a and 15a and die pad portions 14b and 15b of respective lead frames 14 and 15 are formed between upper frames 14c and 15c and lower frames 14d and 15d. FIG. 26 shows that lower semiconductor chip 1b is supposed to be attached to the bottom surface of die pad portion 14b of upper lead frame 14. FIG. 27 shows that upper semiconductor chip 1a is attached to the top surface of die pad portion 15b of lower lead frame 15. In an actual manufacture, before these lead frames are overlapped, to only one of the lead frames, a semiconductor chip is attached. If the semiconductor chips are fastened to both lead frames respectively that have not been overlapped, any inconvenience would occur in alignment.

Figure 28:
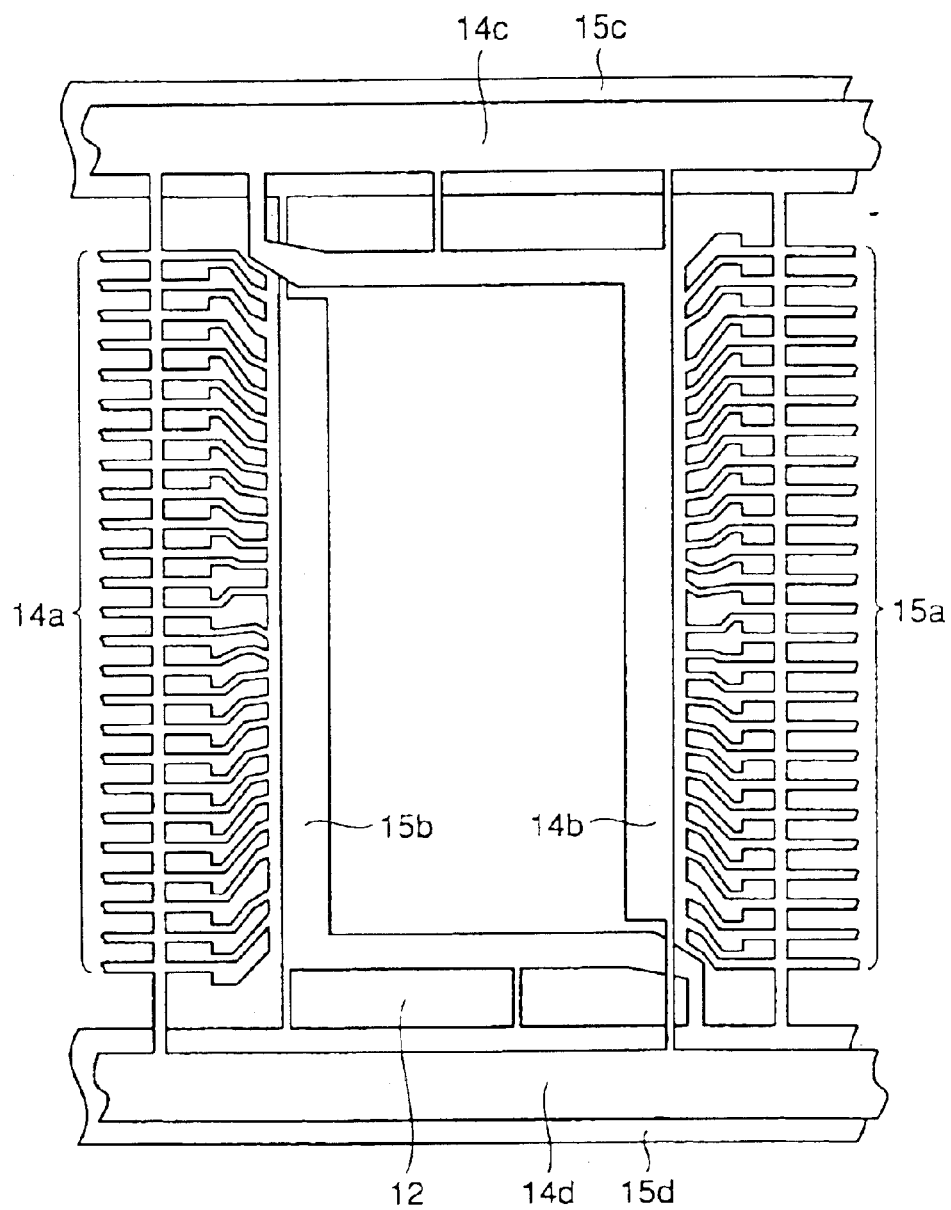
FIG. 28 is a plan view showing the upper lead frame in FIG. 24 and the lower lead frame in FIG. 25 that overlap each other.

FIG. 28 is a plan view showing the positional relation between upper and lower lead frames 14 and 15 overlapping each other with no semiconductor chip attached thereto. Referring to FIG. 28, die pad portion 14b of upper lead frame 14 is located above die pad portion 15b of lower lead frame 15. When lower semiconductor chip 1b is attached to the bottom surface of die pad portion 14b, lower semiconductor chip 1b and die pad portion 15b are nearly at the same height. Further, when upper semiconductor chip 1a is attached to the top surface of lower die pad portion 15b, upper semiconductor chip 1a and die pad portion 14b are nearly at the same height.

Figure 29:
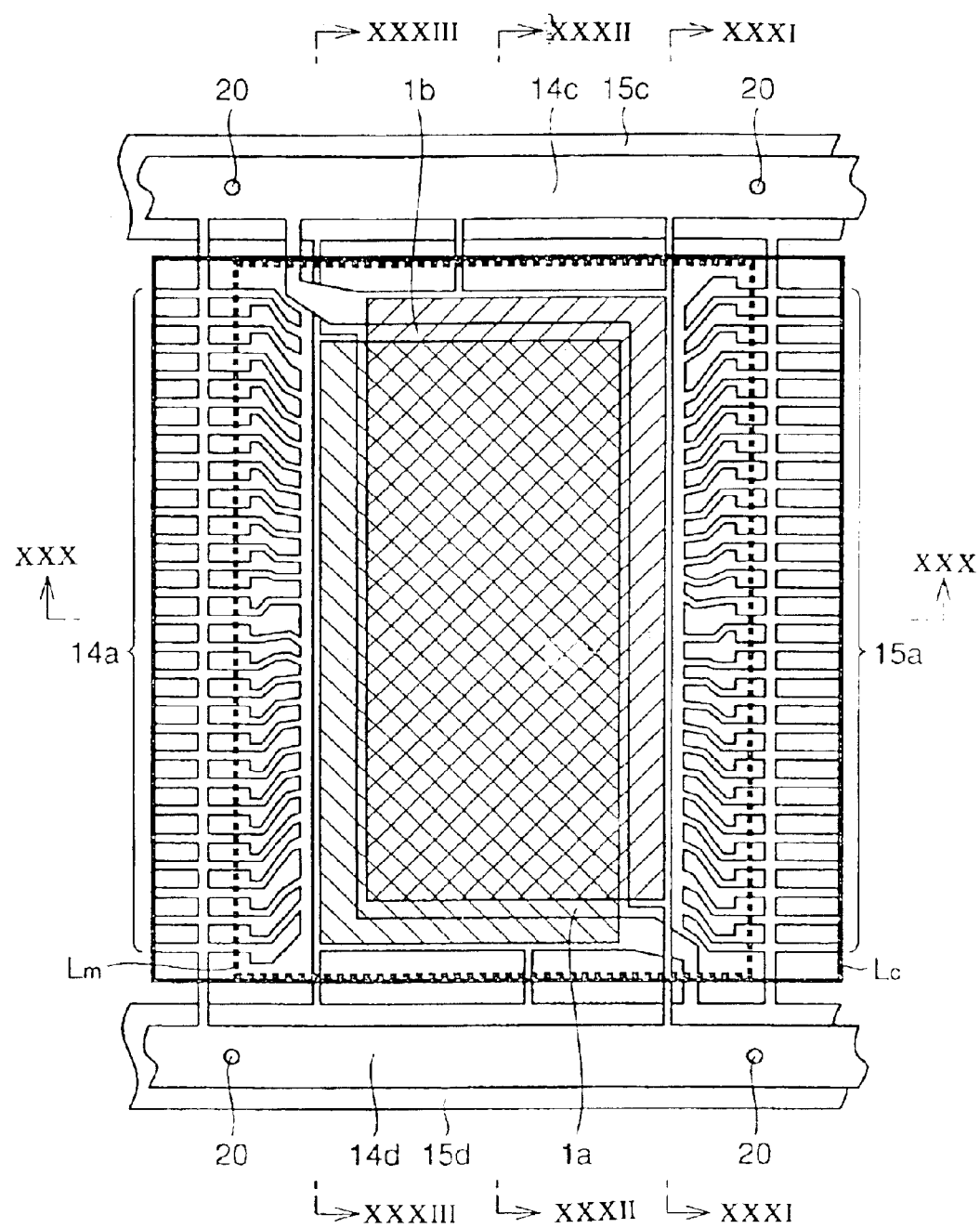
FIG. 29 is a plan view showing the upper and lower lead frames to which respective semiconductor chips are attached and which are overlapped and spot-welded together.
Figure 30:
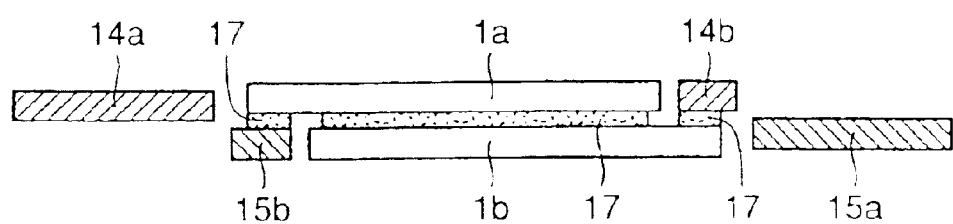
FIGS. 30, 31, 32, and 33 respectively show cross sections along lines XXX—XXX, XXXI—XXXI, XXXII—XXXII, and XXXIII—XXXIII in FIG. 29.
Figure 31:
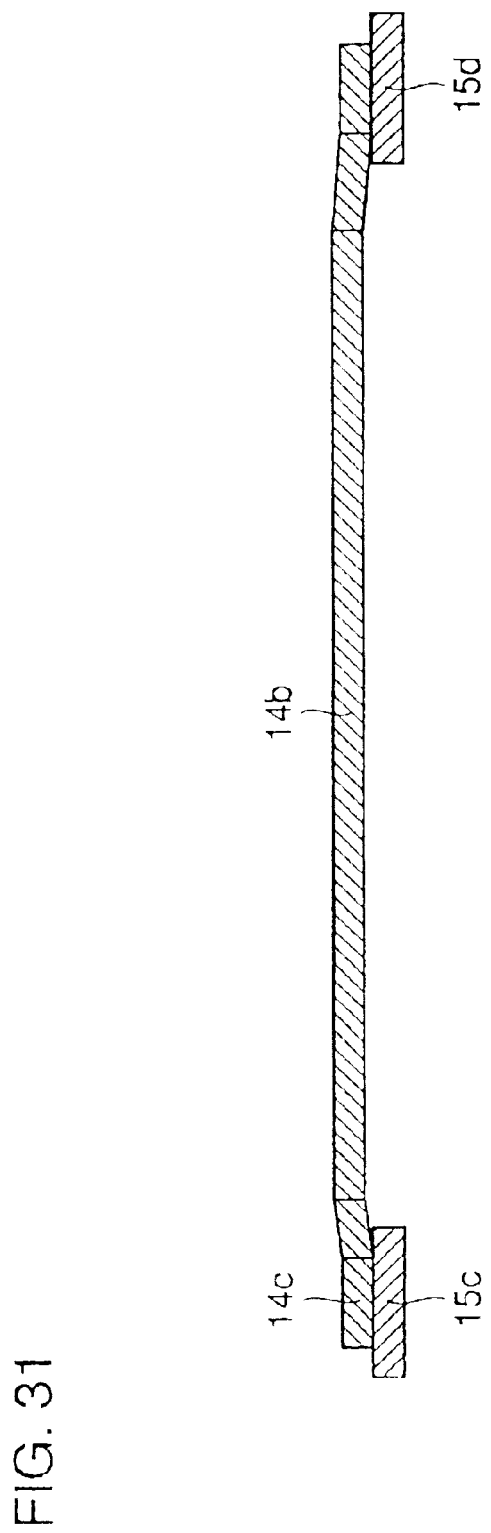
Figure 32:
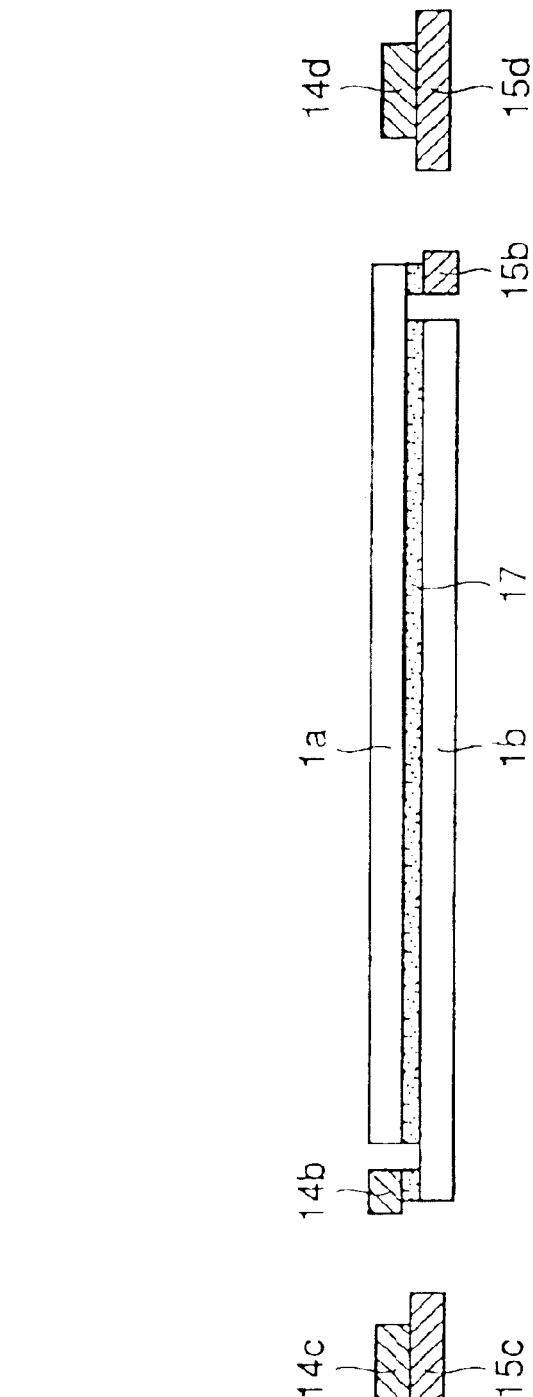
Figure 33:
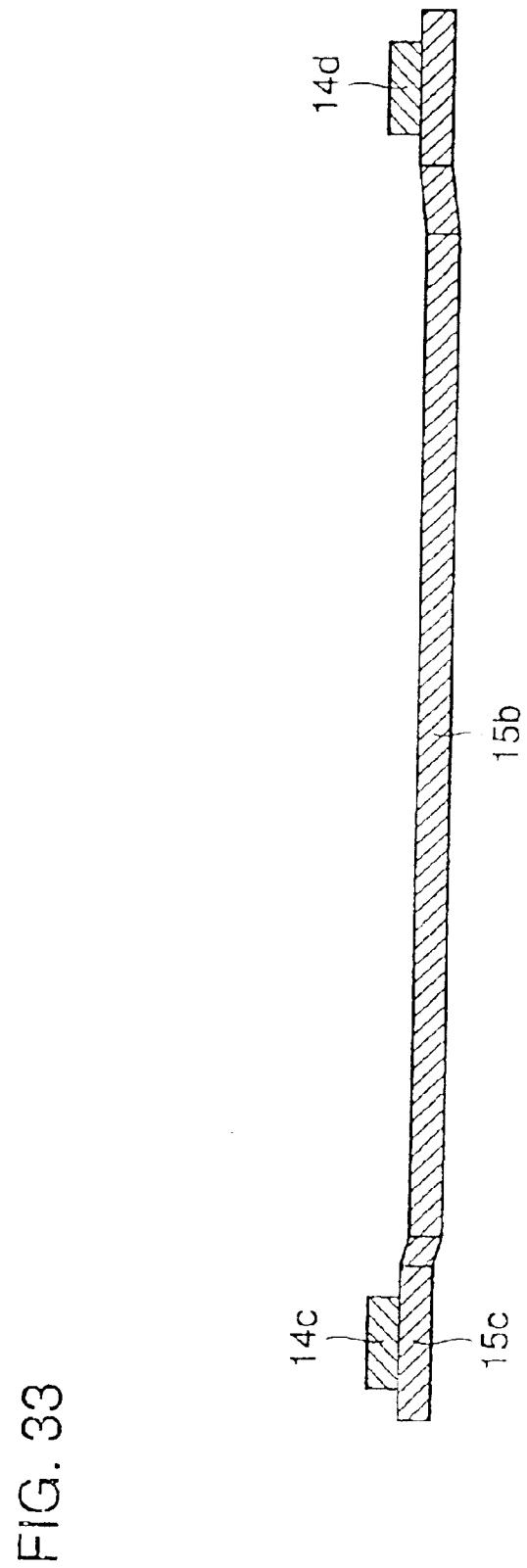

FIG. 29 is a plan view showing that respective semiconductor chips are attached to die pad portions 14b and 15b of two lead frames 14 and 15 (one chip to each die pad portion) and they are overlapped and spot-welded at four corners. Die bonding material is not shown here. The two lead frames are thus firmly coupled by the spot-welding and thereafter upper semiconductor chip 1a and lower semiconductor chip 1b are connected respectively to upper lead portion 14a and lower lead portion 15a by respective wires. The region enclosed by the mold line Lm shown in FIG. 29 is filled with an encapsulating resin to cover the upper side and the lower side and accordingly encapsulate semiconductor chips, wires and the like. Then, a semiconductor device is cut out along the cutting line Lc in FIG. 29.

FIGS. 30, 31, 32, and 33 are cross sections respectively along lines XXX—XXX, XXXI—XXXI, XXXII—XXXII and XXXIII—XXXIII in FIG. 29. It can be understood from these drawings that the thickness of a semiconductor device of TSOP type can be reduced by arranging two semiconductor chips in the region surrounded by lead frames. In addition, the manufacturing method of the second embodiment employing spot welding to accomplish efficient production is suitable for low cost and mass production of semiconductor devices.

(Third Embodiment)

Figure 34:
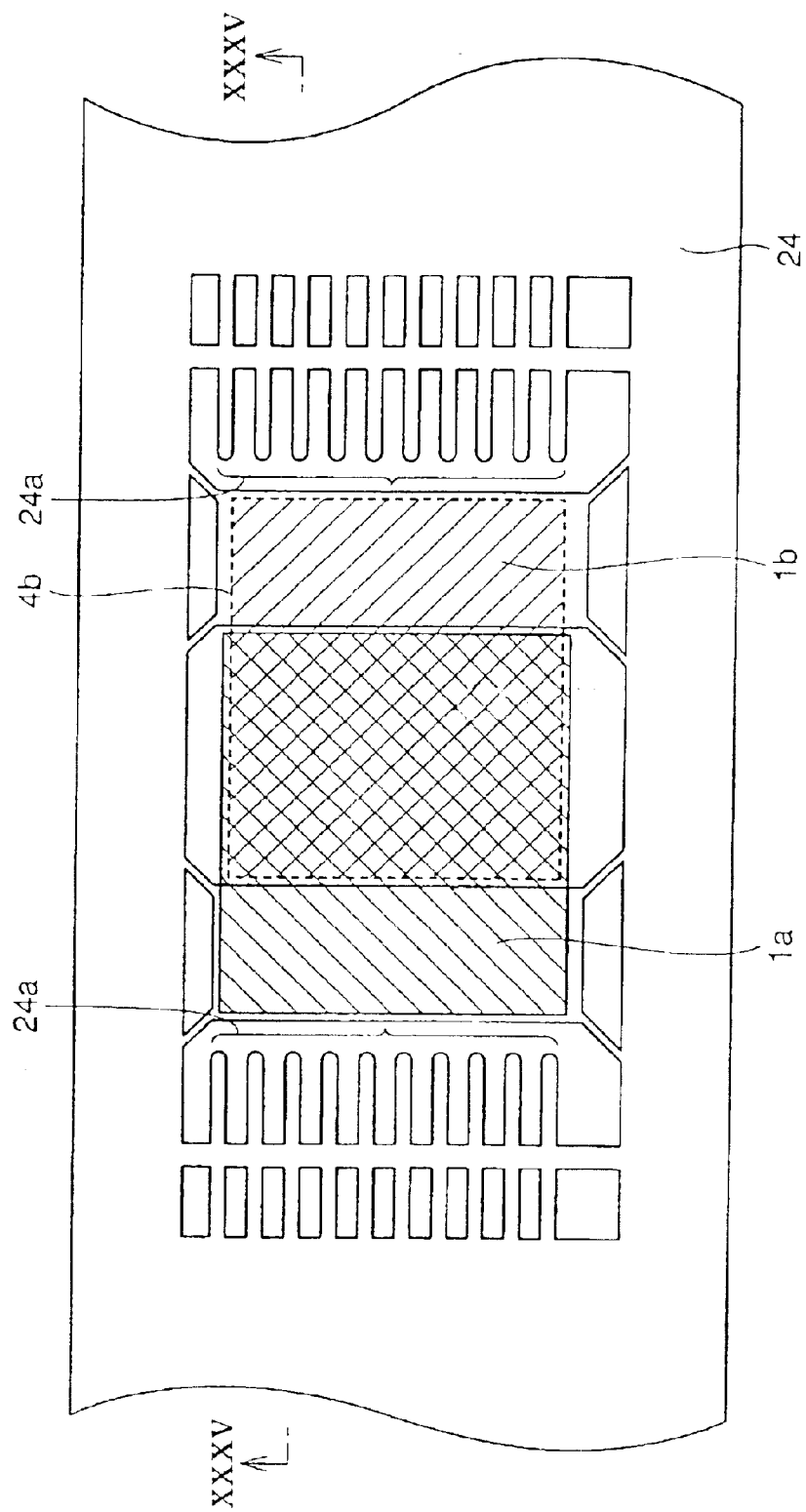
FIG. 34 is a plan view of a semiconductor device according to a third embodiment of the invention.
Figure 35:
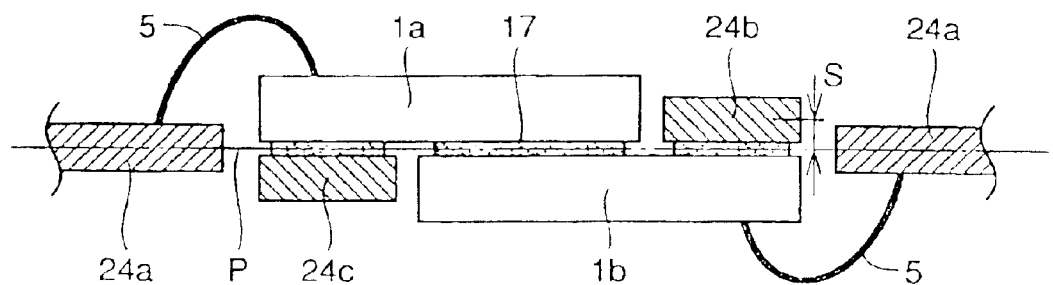
FIG. 35 shows a cross section along line XXXV—XXXV in FIG. 34.
Figure 36:
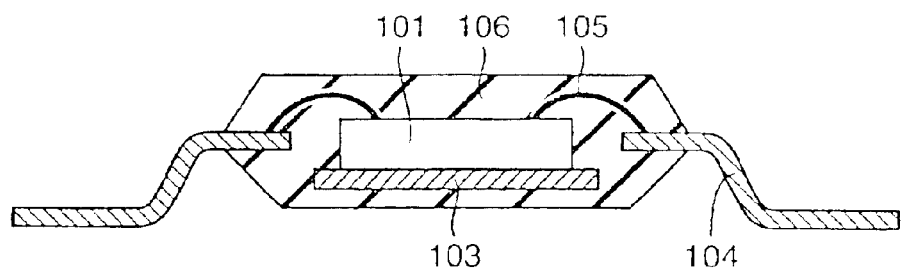
FIG. 36 is a cross sectional view of a conventional semiconductor device.
Figure 37:
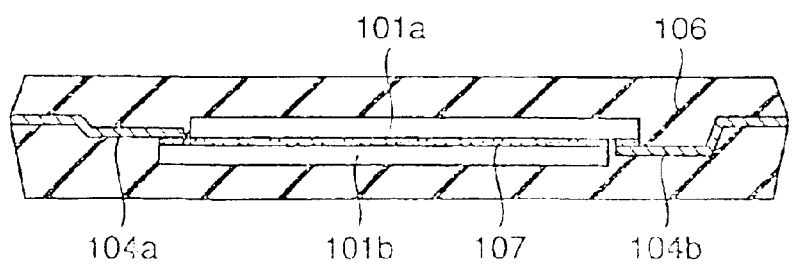
FIG. 37 is a cross sectional view of another conventional semiconductor device.

FIG. 34 is a plan view of a semiconductor device according to a third embodiment of the present invention in an intermediate stage. FIG. 35 is a cross section along A–A' of the semiconductor device shown in FIG. 34. A lead frame 24 includes lead portions 24a and die pad portions 24b and 24c. Read portions 24a on the right and left are located on the same plane. A reference plane P passes through the center of thickness of lead frame 24. Die pad portion 24b is processed such that it is shifted upward relative to the right lead portion 24a and die pad portion 24c is processed such that it is shifted downward relative to the left lead portion 24a. The die pad portions are shifted by distances as shown in FIG. 35 that is equal to the sum of a half of the thickness of lead frame 24 from reference plane P and a half of the thickness of a die bonding material 17. A lower semiconductor chip 1b is attached via die bonding material 17 to the bottom surface of up-shifted die pad portion 24b and an upper semiconductor chip 1a is attached via die bonding material 17 to the upper surface of down-shifted die pad portion 24c.

Regarding the structure discussed above, the overlapping portions of two semiconductor chips and the lead frame do not overlap and semiconductor chips and the like are vertically symmetrical with respect to the lead frame. Accordingly, thermal strain and nonuniform stress distribution rarely occur and a great resistance to deformation like warp is accomplished. Additionally, there is no extra thickness of encapsulating resin.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device TSOP (Thin Small Outline) Package) having:

upper and lower semiconductor chips arranged between a first lead portion and a second lead portion, respectively, on two opposing sides of said semiconductor device, in plan view;

a first die pad integrated with and not coplanar with said first lead portion and located on one side of a reference plane passing through a central position between a first surface and a second surface of said first and second lead portions; and a second die pad integrated with and not coplanar with said second lead portion and located on a second side of the reference plane, wherein said lower semiconductor chip is supported by said first die pad, said upper semiconductor chip is supported by said second die pad, and said upper and lower semiconductor chips are partially overlapping and overlap in height said first and second lead portions.

2. The semiconductor device according to claim 1, including:

a first lead frame connected to said first die pad and located, with said first lead portion, on the first side of said reference plane, and a second lead frame connected to said first die pad and located, with said second lead portion, on the second side of said reference plane.

3. The semiconductor device according to claim 2, said first die pad is L-shaped and includes a first extension extending from an end of said first lead portion toward said second lead portion, and a first opposing portion continuing from said first extension and extending parallel to said first lead portion, said second die pad is arranged, in plan view, opposite said first die pad, is L-shaped, and includes a second extension extending from an end of said second lead portion toward said first lead portion and a second opposing portion continuing from said second extension and extending parallel to said second lead portion, said first extension and said first opposing portion have bottom surfaces supporting said lower semiconductor chip, and said second extension and said second opposing portion have upper surfaces supporting said upper semiconductor chip.

4. The semiconductor device according to claim 1, wherein said first and second lead portions and said first and second die pads are integrated into a common lead frame, said reference plane passes centrally through the thickness of said lead frame, said first die pad supports said lower semiconductor chip of said partially overlapped upper and lower semiconductor chips, and said second die pad supports said upper semiconductor chip.

5. The semiconductor device according to claim 4, including adhesive layers respectively bonding said upper and lower semiconductor chips to said first and second die pads, wherein a center of the thickness of said first die pad and a center of the thickness of said second die pad are spaced from said reference plane in respective opposite directions, each by a distance equal to the sum of one-half the thickness of said lead frame and one-half the thickness of said adhesive layers bonding said upper and lower semiconductor chips to said first and second die pads.

6. The semiconductor device according to claim 1, wherein said lower semiconductor chip is bonded to said first die pad and said upper semiconductor chip is bonded to said second die pad and including a first adhesive layer contacting both of said upper and lower semiconductor chips, and bonding said first die pad to said lower semiconductor chip, said second die pad to said upper semiconductor chip, and said lower semiconductor chip to said upper semiconductor chip.

7. The semiconductor device according to claim 6 including wires electrically connecting said first lead portion to said upper semiconductor chip and connecting said second lead portion to said lower semiconductor chip.

8. The semiconductor device according to claim 6, wherein said upper semiconductor chip is sandwiched by said first die pad and said first lead portion and said lower semiconductor chip is sandwiched by said second die pad and said second lead portion.

* * * * *